Figure 1:
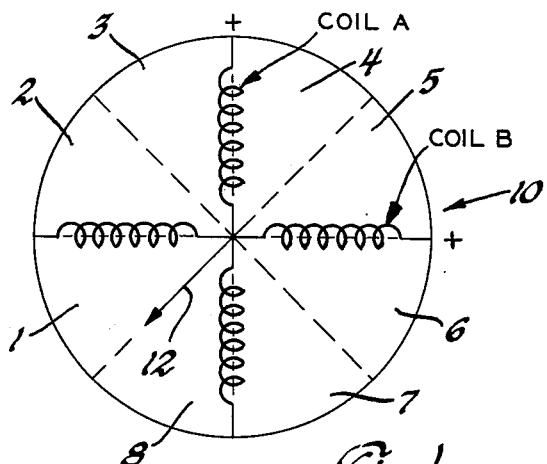

United States Patent [19]   [11]  4,230,984
Taylor   [45]  Oct. 28, 1980

[54] METHOD AND APPARATUS FOR DRIVING AN AIR CORE GAGE

[75] Inventor: David W. Taylor, Grand Bland, Mich.

[73] Assignee: General Motors Corporation, Detroit, Mich.

[21] Appl. No.: 22,822

[22] Filed: Mar. 22, 1979

[51] Int. Cl.² .......................................... G01R 15/08
[52] U.S. Cl. ............................ 324/115; 324/140 R; 324/167
[58] Field of Search ................... 324/115, 131, 140 R, 324/140 D, 144, 173, 174, 169, 78 D

[56] References Cited

U.S. PATENT DOCUMENTS

| | | | |
|---|---|---|---|
| 3,329,893 | 7/1967 | Lawless et al. | 324/131 |
| 3,624,625 | 11/1971 | Stonestreet | 324/144 |
| 3,636,447 | 1/1972 | Gelenius | 324/140 R |
| 3,946,311 | 3/1976 | Baker et al. | 324/140 R |
| 4,051,434 | 9/1977 | Sweet | 324/78 D |
| 4,070,665 | 1/1978 | Glennon et al. | 340/347 SY |

Primary Examiner—David K. Moore
Attorney, Agent, or Firm—Warren D. Hill

[57] ABSTRACT

An air core gage having a pair of coils in quadrature to drive a pointer has the first coil energized by a relatively constant reference current while the second coil is energized by a current which varies as a tangent function of the input quantity in order to drive the pointer through an octant of the gage. The current polarity to the second coil is reversed and the current is again varied in the same manner to vary the pointer through a second octant. Then, the reference current is applied to the second coil and the current is varied in the first coil according to the tangent function to drive the pointer through a third octant, and so on for a wide angle pointer drive. When the input quantity is a frequency, the driving circuit is conveniently a digital circuit including a ROM which stores the tangent function of the input quantity and a steering logic circuit which selectively applies the steady state and the variable signals to the gage coils to effect the appropriate pointer movement.

4 Claims, 10 Drawing Figures a b c

METHOD AND APPARATUS FOR DRIVING AN AIR CORE GAGE

This invention relates to method and apparatus of driving a gage of the type having first and second coils in quadrature to establish a resultant magnetic field and a pointer angularly positioned by the field.

It has been known to drive a wide angle electrical gage with an electronic circuit which generates sine and cosine waveforms in response to an input quantity such as vehicle speed to energize two gage coils for an accurate positioning of the gage pointer. Such systems require separate function generators for the sine and cosine waveforms, and to economize in the circuit design it is known to use relatively simple circuits which produce approximations of the sinusoidal functions. Reasonably accurate systems are produced by that technique, however, it has been found that the accuracy of the gage drive can be further improved and only one trigonometric function generator need be used by employing the techniques of the subject method and apparatus.

It is, therefore, an object of this invention to provide method and apparatus for driving a wide angle gage in an accurate fashion using only a single function generator. It is a further object to provide such a method and apparatus which can readily be carried out by integrated circuits employing digital circuit techniques.

The invention is carried out by providing a steady state reference signal and a varying signal which varies as a tangent function of the input quantity, applying those signals to the two quadrature coils of a gage to drive the pointer to an angle within one sector of the gage dependent on the input quantity and selectively changing the polarities of the two signals and the coils to which they are applied to drive the pointer to other sectors of the gage in dependence on the magnitude of the input quantity. The invention is further carried out by providing a circuit for generating a signal proportional to the magnitude of the input quantity, a function generator responsive to the signal to produce an output varying as a tangent function of the proportional signal, means for producing a variable drive current proportional to the tangent function and a reference steady state drive current, and a steering circuit for selectively applying the two drive currents to the two coils respectively and to control the polarity thereof to thereby position the magnetic field vector and therefore the pointer according to the magnitude of the input quantity.

Figure 2A:
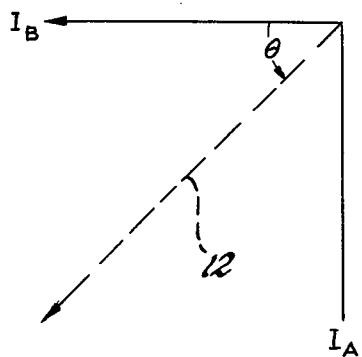
Figure 2B:
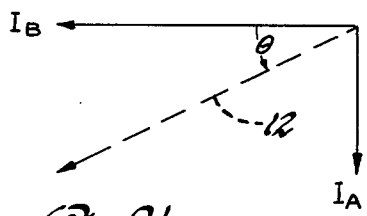
Figure 2D:
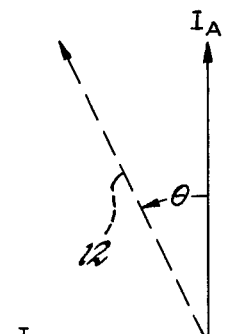
Figure 2C:
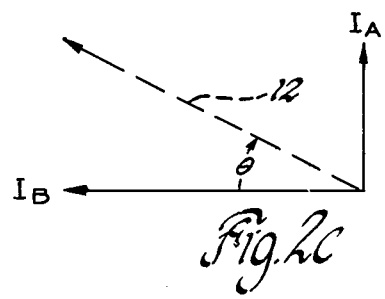
Figure 3:
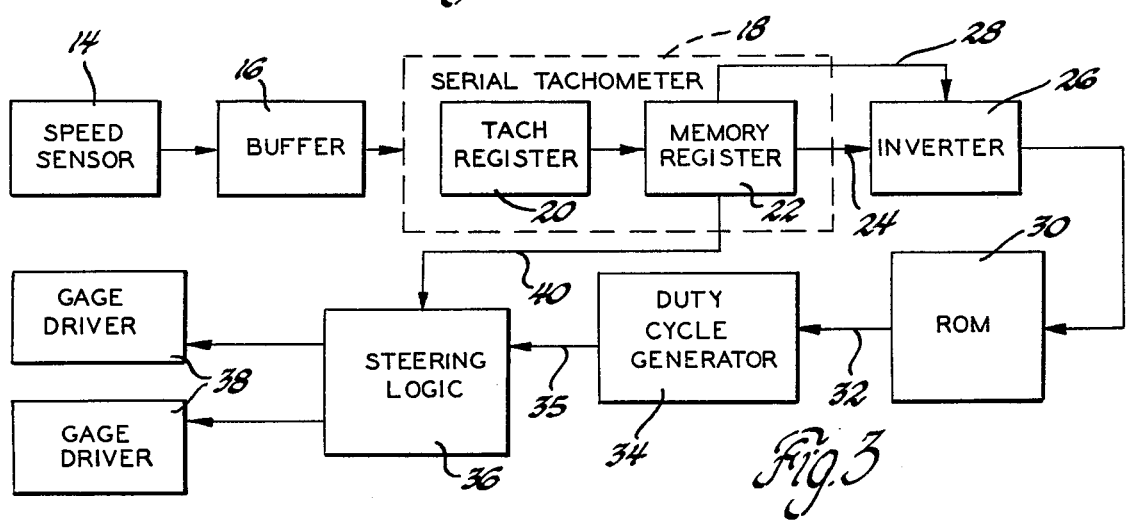
Figure 4:
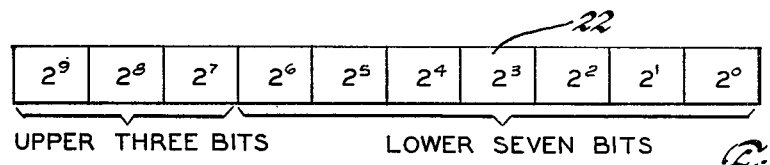
Figure 5:
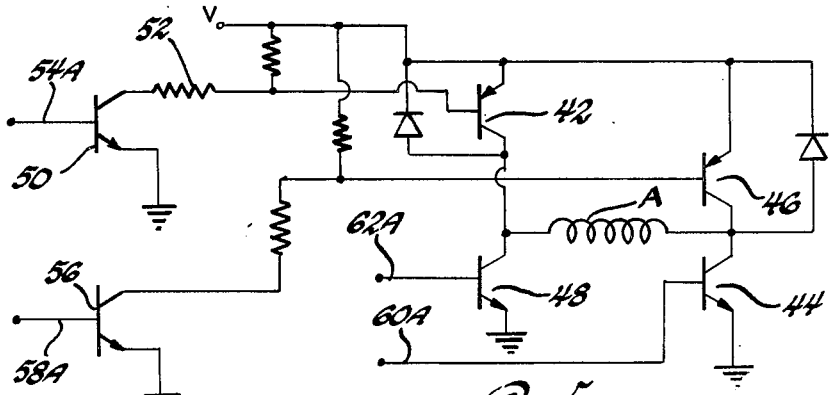
Figure 6:
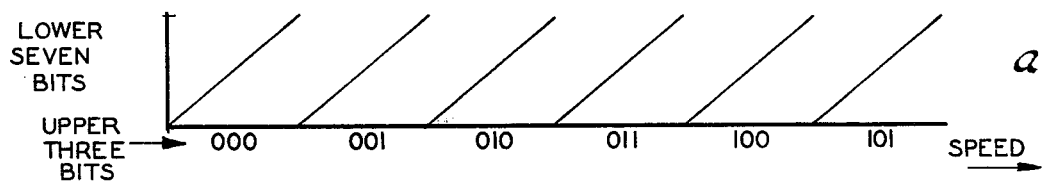
Figure 6:
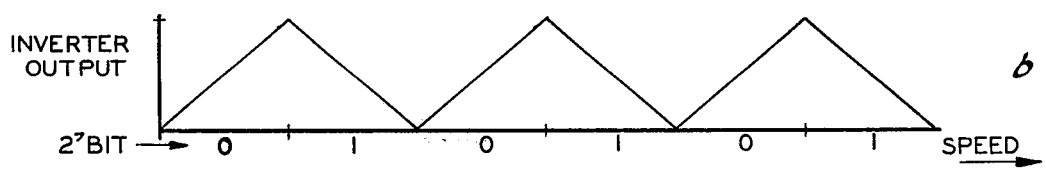
Figure 6:
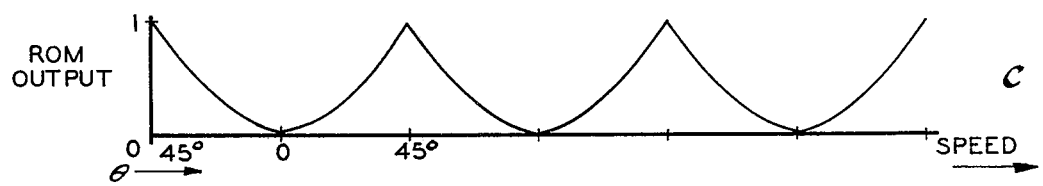
Figure 6:
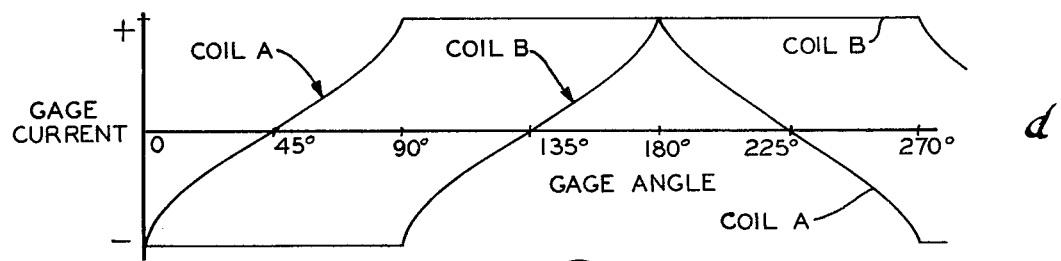
Figure 7:
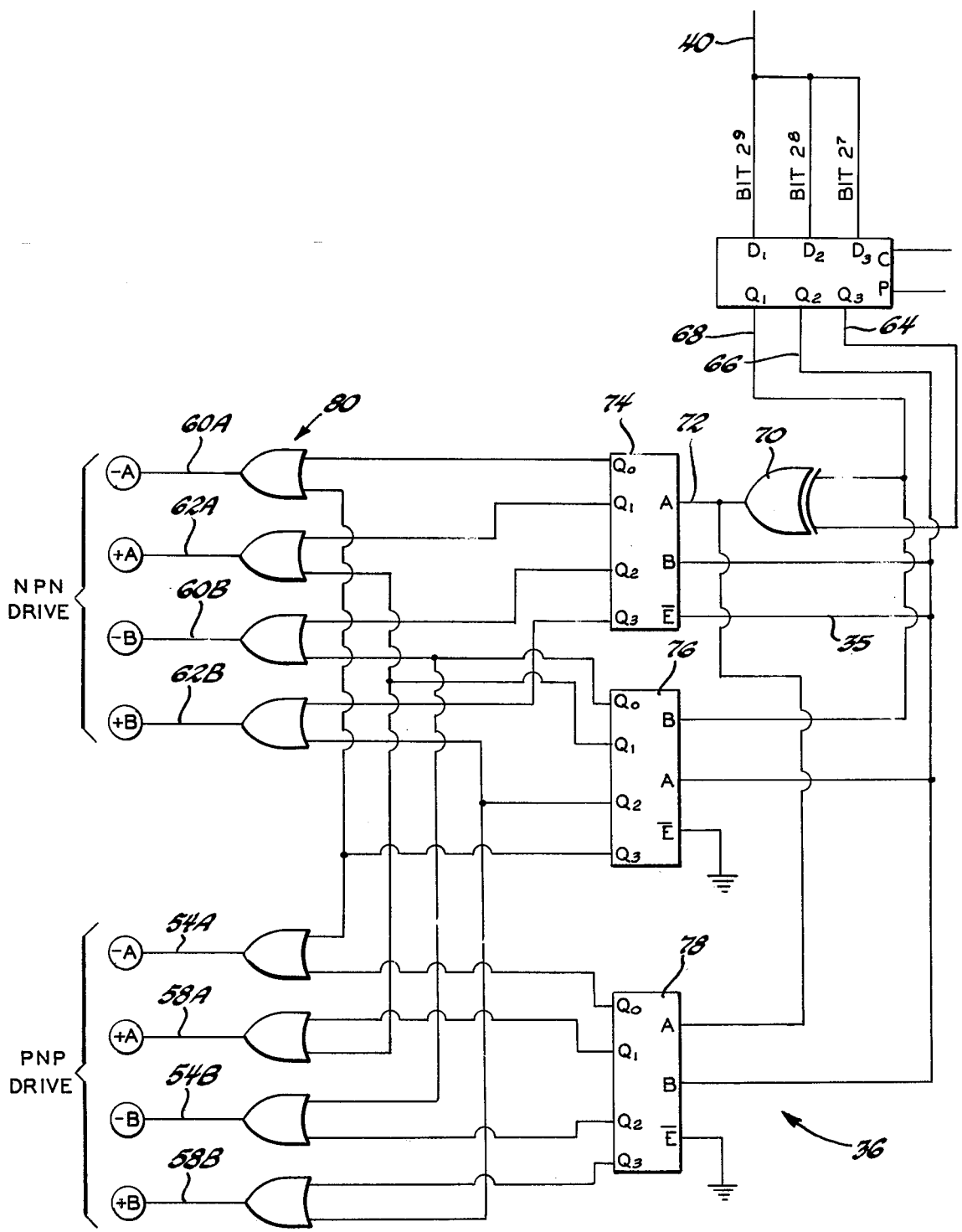

The above and other advantages will be made more apparent from the following specification taken in conjunction with the accompanying drawings wherein like reference numerals refer to like parts and wherein:

FIG. 1 is a diagrammatic illustration of an air core gage,

FIGS. 2a–2d are illustrations of magnetic field vectors occurring in the gage of FIG. 1 when operated according to the subject invention, FIG. 3 is a block diagram of a circuit according to the invention for driving a gage, FIG. 4 is a diagrammatic representation of the memory register of the circuit of FIG. 3, FIG. 5 is a schematic diagram of a gage driver of the circuit of FIG. 3, FIGS. 6a–6d are waveforms representing digital values differential in the circuit according to the invention and the resulting currents applied to the gage, and FIG. 7 is a block diagram of the steering logic circuit of FIG. 3.

FIG. 1 diagrammatically depicts an air core gage of a well known type that is exemplified in the U.S. patent to Gelenius U.S. Pat. No. 3,636,447. The gage 10 incorporates two coils A and B arranged in quadrature and a pointer 12 which is positioned angularly on the face of the gage according to the currents applied to the respective coils A and B, the polarity of the current applied to each coil being a factor in pointer positioning as well as the magnitude of the currents. For purposes of this discussion, the current $I_A$ flowing in coil A is considered to be positive when a magnetic vector toward the upper part of FIG. 1 is produced and the current $I_B$ in the coil B is considered to be positive when its corresponding magnetic vector is directed toward the right of the drawing. For convenience of description, the gage is divided by dotted lines into octants 1–8. When the input quantity being measured is 0, the pointer 12 is positioned on the borderline of octants 1 and 8 as shown in FIG. 1. For increasing values of the input quantity, the pointer moves clockwise through octants 1–8 successively.

Since the individual magnetic fields of the coils depend proportionately on the magnitude and polarity of the driving currents, the field vectors are conveniently labelled with the current notation $I_A$ and $I_B$. As shown in FIG. 2a when both field vectors are at their maximum value in the negative direction, the angle $\theta$ of the pointer 12 with respect to $I_B$ vector is 45°. As shown in FIG. 2b when $I_A$ becomes smaller and $I_B$ remains constant, the angle $\theta$ decreases to move the pointer 12 clockwise through the octant 1. It is readily seen than $\tan \theta$ equals $I_A/I_B$. Thus, so long as $I_B$ remains constant $I_A$ is varied according to a tangent function of the input quantity, the change in the angle $\theta$ will be directly proportional to the change in the input quantity. Thus, the pointer 12 can be accurately positioned anywhere within the octants 1 and 2 by varying only $I_A$ in proportion to a tangent function of the input quantity. FIG. 2c depicts the position of the pointer in the second octant when the vector $I_A$ is directed in the positive direction and the $I_B$ vector is still at its maximum value in the negative direction. In order to move on to the third and fourth octants, the vector $I_A$ is held in its maximum value positive direction and the vector $I_B$ varied to sweep the pointer through the octants 3 and 4. As before, the angle $\theta$ is a measure of the angle between the pointer and the fixed value vector as shown in FIG. 2d.

The following Table I specifies the coil energization required for operation in each octant. The steering logic entry in the table will be explained in the description below:

TABLE I

| Steering Logic Input | Coil Energization A | B | Octant |
|---|---|---|---|
| 000 | $-1 \rightarrow 0$ | $-1$ | 1 |
| 001 | $0 \rightarrow 1$ | $-1$ | 2 |
| 010 | 1 | $-1 \rightarrow 0$ | 3 |
| 011 | 1 | $0 \rightarrow 1$ | 4 |
| 100 | $1 \rightarrow 0$ | 1 | 5 |
| 101 | $0 \rightarrow -1$ | 1 | 6 |
| 110 | $-1$ | $1 \rightarrow 0$ | 7 |
| 111 | $-1$ | $0 \rightarrow -1$ | 8 |

The coil energization designation of 1 and −1 refers to full energization in the positive and negative direction, respectively. Thus, for the operation in the first octant, the coil A varies between −1 and 0 while the coil B is at −1 or full negative energization. In octant 2 the energization of coil A remains from 0 to +1 while the coil B energization remains at −1 and so on. By this scheme the full 8 octants or 360° pointer movement may be realized.

FIG. 3 illustrates the circuit useful for carrying out the method of the invention and is directed in particular to a vehicle speedometer. A speed sensor 14 sensitive to vehicle speed produces a series of pulses at a frequency proportional to the speed. These pulses representing the frequency or input quantity are fed to a buffer 16 and thence to a serial tachometer 18. The serial tachometer is preferably the digital frequency measuring circuit disclosed in the U.S. Pat. No. 4,051,434 of Douglas Sweet, which is incorporated herein by reference. Key elements of the serial tachometer are a tach register 20 and a memory register 22. The serial tachometer enters into the tach register a binary number which is proportional to the speed being measured. The tach register conveniently comprises a 16 bit or 18 bit shift register while the memory register is limited to a 10 bit capacity and stores the upper 10 bits of the tach register since that amount of information is adequate for good gage resolution. Those 10 bits of the memory register 22 are illustrated in the FIG. 4. The lower 7 bits or the set of 7 least significant bits identified as $2^0$ through $2^6$ are applied on line 24 to an inverter 26. The $2^7$ bit is applied on line 28 to a control input of the inverter 26. The output of the inverter 26 addresses a ROM 30. The ROM is programmed to define the tangent of the resultant magnetic vector of the gage such that the angle of the pointer 12 increases linearly with the input frequency from the speed sensor 14. The ROM consists of 128 7 bit words which define one of the currents for a 45° sector or octant of gage pointer position. The output of the ROM is applied by line 32 to a duty cycle generator 34 which produces a signal having a duty cycle proportional to the value of the binary ROM output. The duty cycle signal is fed by line 35 to a steering logic circuit 36 which selectively directs the duty cycle signal to the two gage drivers 38 which energize the gage coils A and B.

The steering logic circuit 36 is controlled by the upper 3 bits or the set of most significant bits of the memory register 22, that is, the bits comprising $2^7$ through $2^9$, which are applied by line 40 to the steering logic circuit. This set of three digits is set forth in Table I as the steering logic input. The function of the steering logic circuit then is to direct the variable duty cycle current to coil A and full current to coil B and to control the proper polarity of those currents when the input is 000 and to otherwise control the coil energization in response to the several inputs as shown in the table. In other words, the octant of gage operation effective at a given time is determined by the steering logic input represented by the upper 3 bits of the memory register 22.

A gage driver circuit 38 is shown in FIG. 5 and includes, for example, coil A and has a voltage supply V, which is connected to the coil to cause current conduction in either direction selectively. A pair of transistors 42 and 44 are arranged to cause current flow in one direction to the coil A and another pair of transistors 46 and 48 are arranged when conductive to pass current to the coil A in the opposite direction.

A transistor 50 with grounded emitter is connected to the base of transistor 42 and to the supply voltage V by voltage dividing resistors 52. The base of transistor 50 is connected to input line 54A from the steering logic circuit so that when line 54A is energized the transistor 42 is turned on. In a similar manner a transistor 56 connected to input line 58A is arranged to turn on transistor 46 when line 58A is energized. The transistors 44 and 48 have their bases connected to input lines 60A and 62A respectively for actuation thereby. The gage driver circuit for coil B is identical to that for coil A. The corresponding input lines are denoted 54B, 58B, 60B and 62B.

Thus, by appropriate energization of the pairs of transistors, the polarity of the coil current is controlled and when a transistor pair is fully conducting, the maximum current determined by voltage V and the coil impedance is applied to the coil. By applying the duty cycle to the base of one of the transistors 44 or 48, the coil current is diminished according to the duty cycle. There is then no distinction between a 100% duty cycle signal and a maximum energization of the coil; variations in the voltage supply V do not affect the ratio of the magnetic vectors for the fully energized coil and the partially energized coil.

FIG. 7 illustrates the steering logic circuit 36 for developing the gage driver energization signals on lines 54A, B through 62A, B. Line 40 comprising conductors for carrying the bits $2^7$ through $2^9$ is connected to three inputs of a latch circuit which provides sustained signals on latch output lines 64, 66 and 68 corresponding to bits $2^7$, $2^8$ and $2^9$, respectively. An exclusive OR gate 70 has its inputs connected to lines 64 and 68. The output of the exclusive OR gate 70 on line 72 and the lines 68 and 66 are selectively connected to the decoders 74, 76 and 78. Those decoders comprise one-of-four decoders which comprise 4,555 integrated circuits, each having an input A, B and $\overline{E}$ and outputs $Q_0$ through $Q_3$. The outputs of each decoder are mutually exclusive according to Table II.

TABLE II

| A | B | $Q_0$ | $Q_1$ | $Q_2$ | $Q_3$ |
|---|---|---|---|---|---|
| 0 | 0 | 1 | 0 | 0 | 0 |
| 1 | 0 | 0 | 1 | 0 | 0 |
| 0 | 1 | 0 | 0 | 1 | 0 |
| 1 | 1 | 0 | 0 | 0 | 1 | when the enable input $\overline{E}$ is energized with a positive voltage, all outputs are 0. The decoder 74 has its enable input $\overline{E}$ connected to the duty cycle line 35 so that the output of decoder 74 carries a signal modulated according to the duty cycle. Decoders 76 and 78 have the enable input grounded to provide full time operation as mandated by the A and B inputs. The decoder outputs are selectively connected as shown in FIG. 7 to eight OR gates 80 which provide the steering logic outputs that become the inputs of the gage drivers on lines 54A, B through 62A, B.

Inspection of the steering logic circuit as shown in FIG. 7 reveals that its operation performs the logic function required by the Table I. For example, if the input bits on line 40 are all 0, then the signals on lines 64, 66, 68 and 72 will all be 0. With the inputs A, B of each decoder at 0 level, the output $Q_0$ of each decoder is 1. The output $Q_0$ of decoder 74 will be modulated by the duty cycle signal so that the line 60A will be energized by a modulated signal. The output $Q_0$ of decoder 76 will cause full time energization of lines 60B and 54B. Finally, the $Q_0$ output of decoder 78 will fully energize the line 54A. By reference to FIG. 5, it is clear that the transistor 44 will be energized by a modulating input to provide a duty cycle conduction of that transistor and the transistor 42 will be conducting to provide a duty cycle current in the negative direction through coil A as required by Table I. Similarly, the full time energization of the lines 60B and 54B will fully energize coil B with a current in the negative direction. Thus, gage operation in octant 1 is accomplished by the steering circuit logic. For operation in octant 2, the steering logic input is 001; then the lines 64 and 72 will be at the one level while the lines 66 and 68 are at the 0 level. The decoder 76 then will have A and B inputs of 0 to produce a $Q_0$ output of 1, as before, so that the 60B and 54B lines are fully actuated to provide the negative current in the B coil. The decoders 74 and 78, however, will each have a 1, 0 input for the A and B terminals respectively to provide $Q_1$ outputs thereby energizing line 62A with a modulated duty cycle current and the line 58A with a full time current thereby driving the coil A in the positive direction by a duty cycle current as required for operation in octant 2.

The operation of the circuit is further explained with reference to the waveform shown in FIG. 6. FIG. 6a, b and c waveforms are analog representations of binary values in the digital circuit. FIG. 6a illustrates that the lower 7 bits of the memory register 22 increase in a repetitive and discontinuous manner with increase of speed, that is, in the first octant of the gage, the register proceeds from a clear condition to a full capacity of the lower 7 bits while the upper 3 bits are each at 0. As the speed further increases beyond the 7 bit capacity, the 7 bits reset to 0 while the 8th bit ($2^7$ bit) increases to 1 to signify the operation in the second octant, and so forth, thus, giving rise to the repetitive series of increasing values in the lower 7 bits of the register.

FIG. 6b illustrates the operation of the inverter 26. The inverter is controlled by the $2^7$ bit of the memory register. When that bit is 0, the lower 7 bits of the register are passed through the inverter to the ROM unchanged, whereas, when the $2^7$ bit is 1, the inverter produces the complement of the lower 7 bit word thereby converting the discontinuous pattern of FIG. 6a to a continuous sawtooth pattern shown in FIG. 6b. The inverter output is fed to the address input of the ROM 30. FIG. 6c shows the variation of the ROM output with speed. Within each octant, the ROM output is a tangent function of the angle represented by the inverter output. The tangent of 45° is 1 and the tangent of 0° is 0 so that the ROM output varies between those limits according to the input address. By selectively applying the equivalent of the ROM output to each of the gage coils and selecting the proper polarity, the gage can be operated over a full 360° range even though the ROM contains only the tangent lookup tables for 0° to 45°.

FIG. 6d illustrates the average current in the coils A and B for each gage position between 0° and 270°. In effect the waveforms of FIG. 6d comprise a pictoral representation of Table I, that is, as speed increases, the waveforms show the variation of the polarity and duty cycle of the current in each coil. Since the current varies in a given coil only in alternate quadrants and is held at a maximum value during the other quadrants, it is seen that only one tangent function generator (ROM 30) is required and that due to the operation of the steering logic circuit 36, the variable current is judiciously applied to the appropriate coil to obtain the linear movement of the pointer with respect to the input quantity or speed.

It is further seen that by repetitively utilizing the 45° tangent lookup table a large amount of tangent function information can be stored in a relatively small ROM and yet a high degree of accuracy and resolution is realized. It is apparent that while the specific illustration herein is directed to a speedometer circuit the same gage drive apparatus can be used for other applications for linearly displaying the value of an input quantity.

The embodiments of the invenion in which an exclusive property or privilege is claimed are defined as follows:

1. The method of driving a gage to indicate a value proportional to the magnitude of an input quantity wherein the gage is of the type having first and second coils in quadrature to establish a resultant magnetic field and a pointer angularly positioned by the resultant field comprising the steps of, providing a substantially constant reference signal, providing a varying signal which varies as a tangent function of the input quantity over each of a plurality of finite ranges, applying the reference signal to the first coil and the varying signal to the second coil when the input quantity is in one range whereby the pointer angle varies throughout one sector of the gage as the input quantity varies throughout the said one range, and applying the reference signal to the second coil and the varying signal to the first coil when the input quantity is in another range adjacent to the said one range whereby the pointer angle varies throughout another sector of the gage as the input quantity varies throughout the said another range.

2. The method of driving a gage to indicate a value proportional to the magnitude of an input quantity wherein the gage is of the type having first and second coils in quadrature to establish a resultant magnetic field and a pointer angularly positioned by the resultant field comprising the steps of, providing a varying current which varies with the input quantity as the tangent of an angle in the range of 0° to 45° over each of a plurality of gage octants, providing a reference current having a value equal to the maximum value of the said varying current, applying the reference current in a first polarity to the first coil and the varying current in a first polarity to the second coil when the input quantity is in a first range whereby the pointer angle varies throughout a first octant of the gage as the input quantity varies throughout the one range, applying the reference current in the first polarity to the first coil and the varying current in a second polarity to the second coil when the input quantity is in a second range adjacent the first whereby the pointer angle varies throughout a second octant of the gage as the input quantity varies throughout a second range adjacent the said one range, applying the reference current in the second polarity to the second coil and the varying current in a first polarity and then a second polarity to the first coil when the input quantity varies throughout respective third and fourth ranges whereby the pointer angle quantity varies throughout third and fourth octants of the gage, and then for subsequent change of the input quantity through further ranges continuing the pattern of alternately applying the reference and variable currents to the respective coils and progressively varying the variable current from maximum value in one polarity and through 0 to maximum value in the other polarity for each pair of octants to progressively change the direction of the pointer angle proportional to changes in the input quantity.

3. Apparatus for driving a gage to indicate a value proportional to the magnitude of an input quantity wherein the gage has first and second coils in quadrature to establish a resultant magnetic field and a pointer angularly positioned by the resultant field, comprising a circuit responsive to the input quantity for generating a signal proportional to the magnitude of the quantity, a function generator responsive to the signal for producing an output which varies as a tangent function of the signal over each of a plurality of finite ranges, and a steering circuit and drive circuit controlled by the said function generator output for producing a variable drive current proportional to the function generator output, and a reference drive current equal to the maximum value of the variable drive current for selectively applying the two drive currents to the two coils respectively, and for controlling the polarity thereof to establish a resultant magnetic field in a direction to position the pointer according to the magnitude of the input quantity.

4. Apparatus for driving a gage to indicate a value proportional to the magnitude of an input quantity wherein the gage has first and second coils in quadrature to establish a resultant magnetic field and a pointer angularly positioned by the resultant field, comprising a circuit responsive to the input quantity to generate a binary number proportional to the magnitude of the quantity, the binary number comprising a set of most significant bits changing in value stepwise as the said magnitude increases and a set of least significant bits changing in a repetitive pattern as the said magnitude increases, a memory addressed by the set of least significant bits for storing a table of numbers representing the tangent of an angle represented by the set of least significant bits to provide a binary output, a circuit responsive to the binary output for producing a varying signal proportional to the tangent of the angle represented by the set of least significant bits, and a steering logic and drive circuit controlled by the varying signal and by the set of most significant bits for producing a variable drive current proportional to the varying signal and a reference drive current equal to the maximum value of the variable drive current, and for selectively applying the two drive currents to the two coils respectively and for controlling the polarity thereof to establish a resultant magnetic field in a direction to position the pointer according to the magnitude of the input quantity.

* * * * *